United States Patent [19]

Yoshino et al.

[11] Patent Number: 5,708,365
[45] Date of Patent: Jan. 13, 1998

[54] METHOD FOR ANALYSIS OF SILICON WAFERS

[75] Inventors: Shiro Yoshino, Sagamihara; Seiichi Shimura, Ebina; Mitsuo Kono, Hadano, all of Japan

[73] Assignee: Komatsu Electronic Metals Co., Ltd., Japan

[21] Appl. No.: 703,887

[22] Filed: Aug. 27, 1996

[51] Int. Cl.⁶ ................................ G01R 27/26
[52] U.S. Cl. .............. 324/537; 324/767; 324/765; 324/762
[58] Field of Search .................. 324/537, 720, 324/752, 705, 766, 767; 437/8

[56] References Cited

U.S. PATENT DOCUMENTS

| | | | |
|---|---|---|---|
| 4,122,383 | 10/1978 | Von Roos | 324/752 |
| 4,333,051 | 6/1982 | Goodman | 324/752 |
| 4,393,348 | 7/1983 | Goldstein et al. | 324/765 |
| 4,433,288 | 2/1984 | Moore | 324/767 |
| 4,454,472 | 6/1984 | Moore | 324/765 |
| 4,841,239 | 6/1989 | Foell et al. | 324/765 |
| 5,010,294 | 4/1991 | Foell et al. | 324/767 |
| 5,091,691 | 2/1992 | Kamieniecki et al. | 324/765 |
| 5,177,351 | 1/1993 | Lagowski | 324/752 |
| 5,453,703 | 9/1995 | Goldfarb | 324/765 |

*Primary Examiner*—Maura K. Regan
*Attorney, Agent, or Firm*—Welsh & Katz, Ltd.

[57] ABSTRACT

A simple method for evaluating the dielectric breakdown of an oxide layer on a silicon wafer is disclosed. The SPV method is utilized to measure a diffusion length $L_{on}$ of minority carriers when the silicon wafer is illuminated by white light from another source and a diffusion length $L_{off}$ of the minority carriers when the silicon wafer is not illuminated by white light from another source. A diffusion length $L_{safe}$, which is determined by trap sites in the silicon wafer, is calculated from an equation $L_{safe}=(L_{off}^{-2}-L_{on}^{-2})^{-1/2}$. Since $L_{safe}$ has a strong correlation with the dielectric breakdown of the oxide layer, the dielectric breakdown of the oxide layer can be easily evaluated by $L_{safe}$ during the fabrication of the silicon wafer.

1 Claim, 2 Drawing Sheets

METHOD FOR ANALYSIS OF SILICON WAFERS

BACKGROUND OF THE INVENTION

The invention relates to a method for evaluating the dielectric breakdown of oxide layers on a silicon wafer.

The dielectric breakdown of the oxide layers has become an important factor for determining the quality of a silicon wafer.

The dielectric breakdown of the oxide layers must be evaluated after oxide layers, electrodes or any other patterns are formed on a silicon wafer to fabricate a MOS device.

An oxide layer having a high breakdown is required in the fabrication of a MOS device. Several methods for improving the dielectric breakdown of the oxide layers have been developed. For example, annealing a silicon wafer in hydrogen ambient within a range of between 1000 and 1300° C. is disclosed in Japanese patent unexamined publication numbers 5-18254, 5-152179, and 5-152230. When the silicon wafer is annealed, oxygen impurities in surface layers of the silicon wafer will diffuse out due to reduction of hydrogen, thus improving the dielectric breakdown of the oxide layer.

However, in order to evaluate the dielectric breakdown of an oxide layer, devices such as gate oxides and gate electrodes must be formed on the silicon wafer. Therefore, the dielectric breakdown of the oxide layer cannot be obtained rapidly and directly.

SUMMARY OF THE INVENTION

Accordingly, the present invention provides a simple method to evaluate the dielectric breakdown of an oxide layer on a silicon wafer.

In the present invention, the method for evaluating the dielectric breakdown of an oxide layer on a silicon wafer is characterized in that the single-crystal silicon wafer is fabricated by the Czochralski method and the diffusion length of minority carriers therein is measured by the surface photovoltage (SPV) method. The dielectric breakdown of an oxide layer can be easily evaluated by determining the diffusion length of minority carriers. A diffusion length $L_{on}$ of minority carriers when the silicon wafer is illuminated and diffusion length $L_{off}$ of minority carriers when the silicon wafer is not illuminated are measured by the SPV method. Then a diffusion length $L_{safe}$ of minority carriers, which is determined by trap sites in the as-grown silicon wafer, can be calculated from an equation $L_{safe}=(L_{off}^{-2}-L_{on}^{-2})^{-\frac{1}{2}}$ to represent the dielectric breakdown of the oxide layer.

In studying how a structure of the trap sites influence the minority carriers in a silicon wafer, a strong correlation between the diffusion length $L_{safe}$ determined by the trap sites and the dielectric breakdown of the oxide layer of the as-grown silicon wafer is discovered. Therefore, the method for evaluating the dielectric breakdown of an oxide layer can be simplified by calculating the diffusion length $L_{safe}$. Moreover, evaluation of the dielectric breakdown of oxide layer on a silicon wafer can be easily and rapidly carried out by an SPV device which is provided with the aforementioned equation for calculation of the diffusion length $L_{safe}$.

DETAILED DESCRIPTION OF THE INVENTION

The simple method for evaluating the dielectric breakdown of an oxide layer on a silicon wafer will be described in reference to the drawings. An n-type single-crystal silicon rod, which is fabricated by the Czochralski method, is divided into a number of portions and each test wafer sliced out from each of the portions is evaluated. In addition, the SPV method is utilized to measure the diffusion length of minority carriers in a region near each test wafer.

When the Czochralski method is utilized to fabricate single-crystal silicon, trap sites may exist in as-grown silicon to trap minority carriers. A high trap site density will reduce the diffusion length measured by the SPV method. That is, the existence of trap sites in the silicon wafer will influence the SPV measurement results. However, when a weaker white light from another source than a light emitted while measuring is used with the SPV method, the trap sites cannot trap any minority carrier because of saturation. Therefore, the influence of trap sites on the SPV measurement can be avoided. The variation of light sources is called a Detrapper (D/T) function of the SPV measurement.

Hereon, the influence on the minority carriers by the trap sites in as-grown silicon wafer can represent the dielectric breakdown of the oxide layer. In other words, the life time $\tau_{mea}$ of trap sites should be measured. Concretely, by separating the life time $\tau_{mea}$ which is given by measurement into $\tau_{safe}$ due to the trap sites in as-grown silicon wafer and $\tau_{other}$ due to other trap sites, the $\tau_{safe}$ is given. Life time $\tau_{safe}$ satisfies the following equation:

$$1/\tau_{mea}=1/\tau_{safe}+1/\tau_{other} \quad (1)$$

Moreover, if L is the diffusion length of minority carriers, D is a diffusion constant, and $\tau$ is the life time of trap sites, they must satisfy the following equation:

$$L=(D\cdot\tau)^{1/2} \quad (2)$$

When a Detrapper-ON state SPV method is utilized to measure an as-grown silicon wafer, that is, when the silicon wafer is measured while illuminating a white light thereon, the diffusion length of minority carriers without the influence of trap sites can be measured. Alternatively, when in a Detrapper-OFF state, that is, when other than white light is used to illuminate, the diffusion length of minority carriers influenced by the trap sites can be obtained. Therefore, the influence of trap sites in the as-grown silicon wafer can be obtained by subtracting the two measured diffusion lengths. Namely, a diffusion length $L_{safe}$ which is determined by the trap sites in the as-grown silicon wafer can be calculated from the following equation:

$$L_{safe}=(L_{off}^{-2}-L_{on}^{-2})^{-\frac{1}{2}} \quad (3)$$

where $L_{on}$ represents the diffusion length of minority carriers when the silicon wafer is illuminated by a white light, and $L_{off}$ is the diffusion length of minority carriers when the silicon wafer is illuminated by other than white light.

Figure 1:
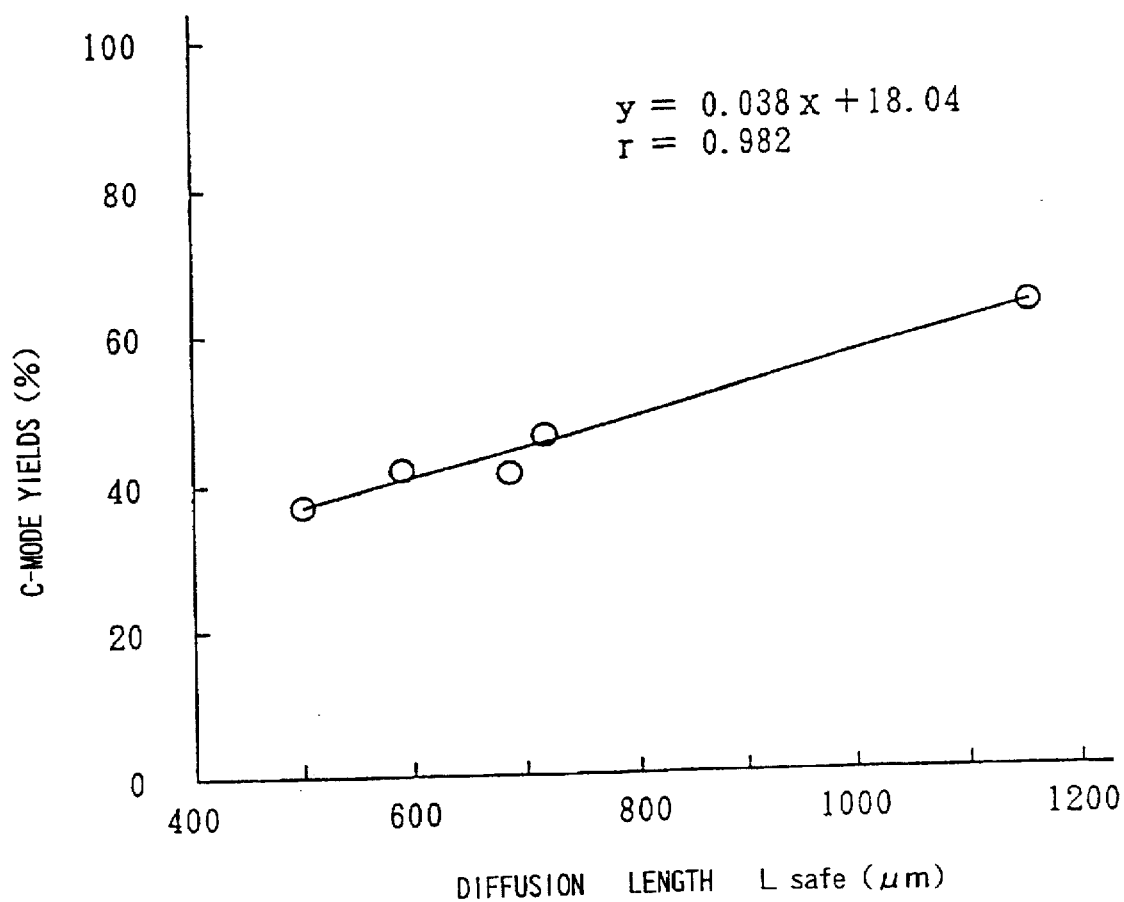
FIG. 1 is a schematic diagram illustrating the relationships between diffusion length $L_{safe}$ of minority carriers and C-mode yields of as-grown silicon wafers.

FIG. 1 shows the relationships between diffusion length $L_{safe}$ and a C-mode yields of as-grown silicon wafers. For a silicon wafer with C-mode yield, The breakdown dielectric field of an oxide layer must be higher than 8 MV/cm. The plot in FIG. 1 is obtained from the evaluation results of the dielectric breakdown of an oxide layer and measured diffusion length $L_{safe}$. The evaluation results of the dielectric breakdown of an oxide layer are measured from the test sample in each portion of the single-crystal silicon rod, while the diffusion length $L_{safe}$ is obtained from regions near the test sample. Since the correlation coefficient r between diffusion length $L_{safe}$ and C-mode yield is as strong as 0.982 (i.e., r=0.982), there is no doubt that the value of $L_{safe}$ can represent the dielectric breakdown of oxide layer.

Figure 2:
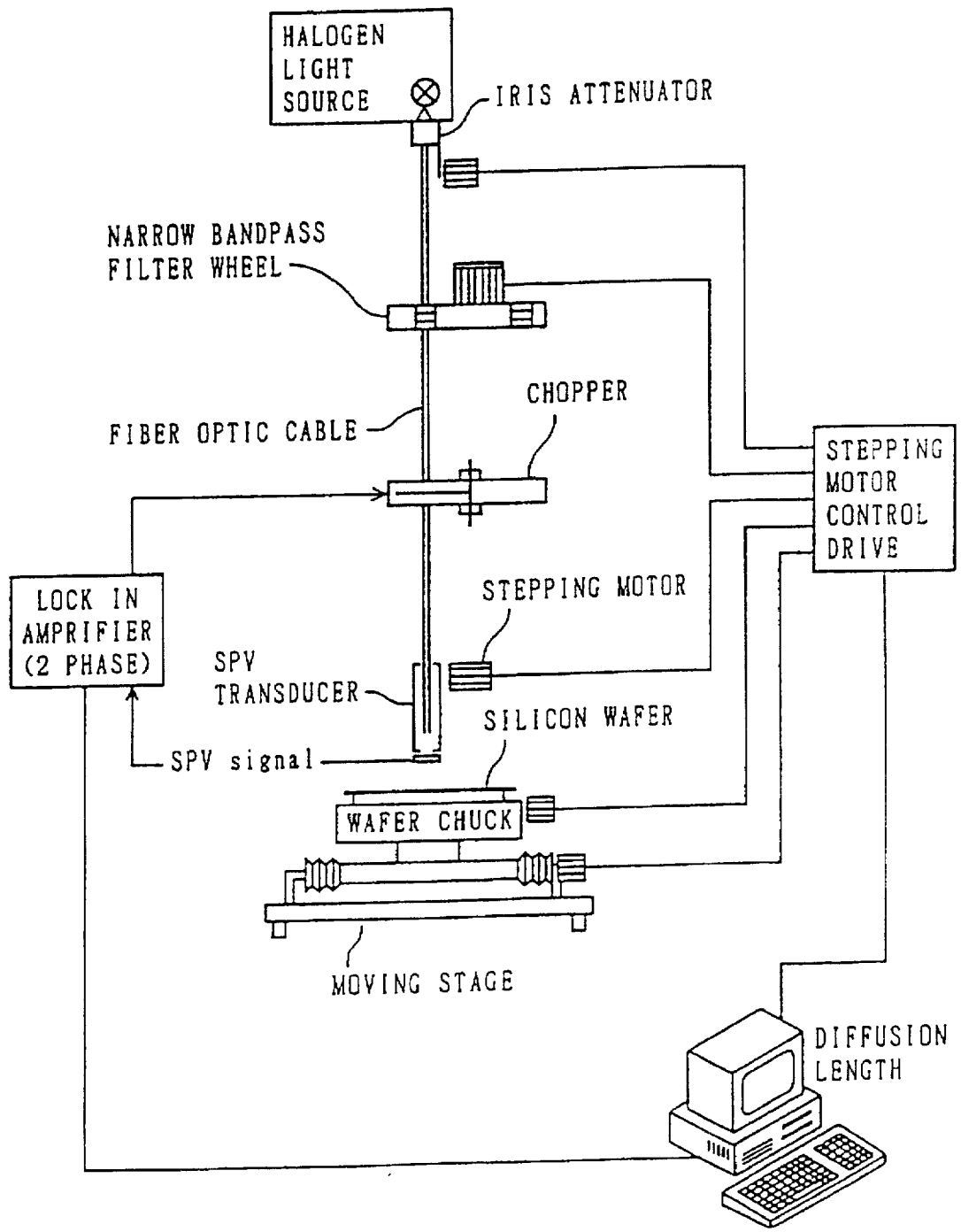
FIG. 2 illustrates the structure of an SPV device.

FIG. 2 illustrates the structure of an SPV device which is produced by SEMICONDUCTOR DIAGNOSTICS INCORPORATED company. Referring to the figure, light rays generated by a halogen light source are attenuated through an iris attenuator. The light rays pass through a narrow bandpass filter wheel, a chopper, and a detector before illuminating the surface of a silicon wafer. The detector is an ITO (a transparent electrode) at the lower end of an SPV transducer. The SPV results can be obtained from comparing the SPV on the silicon surface and the detected value in the ITO. Since the equation for calculating the diffusion length according to the trap sites in the as-grown silicon wafer is stored in the SPV device, the dielectric breakdown of oxide layer can be obtained rapidly. That is, in the SPV device, diffusion length $L_{on}$ of minority carriers when lights shine on the silicon wafer is illuminated by light and diffusion length $L_{off}$ of minority carriers when the silicon wafer is illuminated by light are put into equation $L_{safe}=(L_{off}^{-2}-L_{on}^{-2})^{-1/2}$ to determine diffusion length $L_{safe}$. Therefore, the evaluation efficiency can be improved.

As mentioned above, since the diffusion length of minority carriers can be measured by the SPV method, the present invention determines the diffusion length of minority carriers according to the trap sites in as-grown silicon wafers, thus finding the dielectric breakdown of the oxide layer. The present invention evaluates the dielectric breakdown of the oxide layer by an SPV device containing an evaluation equation, therefore, no gate oxide layer or electrode need be formed over the silicon wafer, and the dielectric breakdown of the oxide layer can be determined rapidly, thus increasing the production efficiency of semiconductor substrates.

What is claimed is:

1. A method for evaluating a dielectric breakdown of an oxide layer on a silicon wafer fabricated by the Czochralski process, based on results of measurement of diffusion lengths of minority carriers in the silicon wafer by the surface photovoltage process; wherein the method comprises the steps of:

measuring a diffusion length $L^{on}$ of the minority carriers of the silicon wafer while illuminating by another light source;

measuring a diffusion length $L_{off}$ of the minority carriers of the silicon wafer without illuminating by another light source; and calculating a diffusion length $L_{safe}$ of the minority carriers from an equation $L_{safe}=(L_{off}^{-2}-L_{on}^{-2})^{-1/2}$; where $L_{safe}$ is determined by trap sites in the as-grown silicon wafer and represents the dielectric breakdown of the oxide layer.

* * * * *